United States Patent
Zhang et al.

(10) Patent No.: US 9,166,529 B2
(45) Date of Patent: Oct. 20, 2015

(54) AMPLIFIER CIRCUIT WITH CROSS WIRING OF DIRECT-CURRENT SIGNALS AND MICROWAVE SIGNALS

(75) Inventors: Bin Zhang, Nanjing (CN); Hongqi Tao, Nanjing (CN)

(73) Assignee: CHINA ELECTRONICS TECHNOLOGY GROUP CORPORATION NO. 55 RESEARCH INSTITUTE, Nanjing (CN)

( * ) Notice: Subject to any disclaimer, the term of this patent is extended or adjusted under 35 U.S.C. 154(b) by 0 days.

(21) Appl. No.: 14/400,334

(22) PCT Filed: Jun. 19, 2012

(86) PCT No.: PCT/CN2012/077135
§ 371 (c)(1),
(2), (4) Date: Nov. 11, 2014

(87) PCT Pub. No.: WO2013/174052
PCT Pub. Date: Nov. 28, 2013

(65) Prior Publication Data
US 2015/0162876 A1    Jun. 11, 2015

(30) Foreign Application Priority Data
May 23, 2012    (CN) .......................... 2012 1 0161501

(51) Int. Cl.
*H03F 3/191*    (2006.01)
*H03F 1/02*    (2006.01)
(Continued)

(52) U.S. Cl.
CPC .............. *H03F 1/0205* (2013.01); *H01L 23/66* (2013.01); *H03F 3/193* (2013.01); *H03F 3/195* (2013.01); *H03F 3/21* (2013.01); *H03F 3/211* (2013.01); *H03F 3/245* (2013.01);
(Continued)

(58) Field of Classification Search
CPC ................................ H03F 3/191; H03F 1/0288
USPC ............................... 330/302, 124 R, 295, 126
See application file for complete search history.

(56) References Cited

U.S. PATENT DOCUMENTS 5,742,205 A * 4/1998 Cowen .................... H03F 1/223
                                                        330/269
5,955,926 A * 9/1999 Uda ........................ H03F 3/604
                                                        330/295

(Continued)

FOREIGN PATENT DOCUMENTS

CN          201215956 Y    4/2009
CN          101944880 A    1/2011
EP          1352468 A2    10/2003

*Primary Examiner* — Henry Choe
(74) *Attorney, Agent, or Firm* — Gokalp Bayramoglu

(57) ABSTRACT

Provided is an amplifier circuit with cross wiring of direct-current signals and microwave signals, which includes: two branch sub-circuits being mirrors with each other and a third capacitor The sub-circuit includes a direct-current feeding circuit and a microwave signal circuit. The direct-current feeding circuit further comprising: a transistor core drain power-up port (Vds) of a heterojunction field effect transistor (FET), a first micro-strip inductor, a first capacitor, a pair of third inductors, a pair of branched second inductors. The microwave signal circuit further comprising: A pair of third inductors, a pair of first capacitors, a pair of second capacitors, a pair of ground inductors, a pair of fourth inductors, a serially connected fifth inductor.

9 Claims, 3 Drawing Sheets

(51) Int. Cl.
*H03F 3/195* (2006.01)
*H03F 3/21* (2006.01)
*H01L 23/66* (2006.01)
*H03F 3/24* (2006.01)
*H03F 3/193* (2006.01)

(52) U.S. Cl.
CPC . *H01L 2223/6655* (2013.01); *H01L 2924/0002* (2013.01); *H03F 2200/108* (2013.01); *H03F 2200/171* (2013.01); *H03F 2200/267* (2013.01); *H03F 2200/391* (2013.01)

(56) References Cited

U.S. PATENT DOCUMENTS

| | | | |
|---|---|---|---|
| 7,800,448 B2* | 9/2010 | Blednov | H03F 1/0288 330/124 R |
| 8,354,882 B2* | 1/2013 | Blednov | H03F 1/0288 330/124 R |
| 2004/0222848 A1* | 11/2004 | Shih | H03F 1/30 330/66 |
| 2008/0290948 A1* | 11/2008 | Fujii | H03F 3/602 330/295 |

* cited by examiner

AMPLIFIER CIRCUIT WITH CROSS WIRING OF DIRECT-CURRENT SIGNALS AND MICROWAVE SIGNALS

FIELD OF THE INVENTION

The present invention relates to an amplifier circuit with cross wiring of direct-current signals and microwave signals, and more particularly to a microwave and millimeter-wave high-power monolithic integrated power amplifier circuit with cross wiring of direct-current signals and microwave signals, and belongs to the field of communications technologies.

DESCRIPTION OF RELATED ART

A microwave and millimeter-wave high-power monolithic integrated power amplifier is a core device in a microwave detection and guidance system and is used for amplifying a low-power signal into a high-power signal, which increases the radiation power of an emitter in the system, thereby increasing a detection distance. With the development of a microwave detection and guidance system, it is required to increase a detection distance and also reduce energy consumption, thereby improving efficiency of the amplifier.

In an aspect, a microwave and millimeter-wave high-power monolithic integrated power amplifier is required to have high output power and high efficiency. In another aspect, during batch production, to improve consistency and the yield rate and reduce the cost, a chip must be miniaturized.

High-power output requires supply of a large current, and therefore, to bear a large current, a feeding circuit usually has a line width of 100 μm, which is more than twice as large as the width of a signal line, occupies 1/10 of a radial distance of a chip tail-level space, and occupies a large chip area. In addition, the acquisition of high power and high efficiency requires proper matching at an output end. Common T and π matching circuits and several branches of derivative forms thereof are easy to make flexible adjustment in the circuit design and layout for signals in different frequency bands, especially, broadband signals. Due to the limit of the chip size, a microwave and millimeter-wave high-power monolithic integrated power amplifier chip has a very limited wiring space in a tail-level circuit layout.

A tail-level unit in an existing microwave and millimeter-wave high-power monolithic integrated power amplifier has a large grid-width transistor core and low output impedance. A typical structure is shown in FIG. 1. A tail-level transistor core 170 passes through two mirrored output circuits 101, 102, and reaches an output port 112 after being connected to an inductor 134 in series and connected to a capacitor 135 in parallel. An output subcircuit 101 includes a Vds port 111, a capacitor 121 connected in parallel, a capacitor 131 connected in series, a pound micro-strip 132 connected in parallel, micro-strip lines 122, 133, a micro-strip combining unit 151, capacitors 141, 142 in parallel, and micro-strip combining units 161, 162. The disadvantage of the circuit implemented in this manner is that passing through the parallel connected capacitors 141, 142, the matching unit needs combining first to be connected to the capacitor 131, which limits the freedom of the circuit design. Meanwhile, the serially connected capacitor 131 and the parallel connected ground micro-strip 132 have very high sensitivity to performance. Also, the electromagnetic field of a region 1 is discontinuous, and the microwave matching circuit is also not completely symmetrical about the transistor core. For a matching circuit having a large grid width, high power, and a high impedance transformation ratio, the performance of the matching circuit will be significantly limited.

SUMMARY OF THE INVENTION

Technical Problem

The task of the present invention is to propose an amplifier circuit with cross wiring of direct-current signals and microwave signals, so as to fully explore the performance of a large grid width transistor core, and significantly improve layout density and a chip space utilization rate, thereby solving the problem of matching of a broadband circuit having a high impedance ratio of a large grid width power chip.

Technical Solution

A transistor core direct-current feeding circuit and a microwave signal circuit are completely symmetrical about a high-electron-mobility transistor (HEMT) cell, so as to fully exert the performance of a transistor core FET. Meanwhile, a parallel connected second capacitor may be directly connected to a capacitor in series, thereby improving the freedom of circuit design. Compared with the prior art, a serially connected capacitor (131) is implemented by serially connected first capacitors (251, 252), and a parallel connected ground micro-strip (132) is implemented by parallel connected ground inductors (261, 262); therefore, the circuit sensitivity of elements in the present invention is lowered. Meanwhile, the solution of the present invention has a symmetrical circuit structure, and a severely discontinuous region of an electromagnetic field does not exist.

To achieve the foregoing task, the basic technical solution of an amplifier circuit with cross wiring of direct-current signals and microwave signals of the present invention is formed of two branch sub-circuits (201, 202) being mirrors with each other and a third capacitor (2101) connected in parallel to an output end. The sub-circuit includes a direct-current feeding circuit and a microwave signal circuit. The direct-current feeding circuit is mainly formed of a transistor core drain power-up port (Vds) of a heterojunction field effect transistor (FET), a first capacitor (281), a first micro-strip inductor (241), a pair of second inductors (231, 232), and a pair of third inductors (211, 212). The transistor core drain power-up port (Vds) of the heterojunction FET is connected to a first micro-strip inductor (241) in series after passing through the first capacitor (281) connected in parallel, is respectively connected to one of the pair of third inductors (211, 212) in series by the pair of branched second inductors (231, 232), and is respectively connected to a drain port of the heterojunction FET core. The microwave signal circuit is mainly formed of a pair of third inductors (211, 212), a pair of second capacitors (221, 222), a pair of first capacitors (251, 252), a pair of ground inductors (261, 262), a pair of fourth inductors (271, 272), and a fifth inductor (291). The pair of third inductors (211, 212) is respectively connected to one of the pair of first capacitors (251, 252) in series after respectively passing through one of the pair of second capacitors (221, 222) connected in parallel, is respectively connected to one of the pair of ground inductors (261, 262) in parallel, is respectively connected to one of the pair of fourth inductors (271, 272) in series, and is combined to be connected to an output end through the serially connected fifth inductor (291).

A further improvement in the technical solution of the present invention is that a three-dimensional cross is formed between any serially connected inductor of the direct-current feeding circuit and any serially connected inductor of the microwave signal circuit, and a three-dimensional cross between a microwave signal and a direct-current signal is implemented in an air bridge manner.

Yet a further improvement in the technical solution of the present invention is that lumped inductors or distributed micro-strip lines are adopted for the first inductor and the pair of second inductors in the direct-current feeding circuit and the pair of fourth inductors and the fifth inductor in the microwave signal circuit.

Another further improvement in the technical solution of the present invention is that outputs of two subunits that are mirror circuits with each other are combined to reach an output (Pout) port through the parallel connected third capacitor.

Yet another further improvement in the technical solution of the present invention is that the heterojunction FET is a HEMT, the transistor core of the HEMT may be extended into 8 cells, and every two cells are combined to be connected to one of the serially connected third inductors (211, 212).

Advantageous Effect

After the foregoing technical solution of the present invention is adopted, a transistor core direct-current feeding circuit and a microwave signal circuit are completely symmetrical about a HEMT cell, so as to fully exert the performance of a transistor core FET. Meanwhile, a parallel connected second capacitor may be directly connected to a capacitor in series, thereby improving the freedom of circuit design. Compared with the prior art, a serially connected capacitor (131) is implemented by serially connected first capacitors (251, 252), and a parallel connected pound micro-strip (132) is implemented by parallel connected ground inductors (261, 262); therefore, the circuit sensitivity of elements in the present invention is lowered. Meanwhile, the solution of the present invention has a symmetrical circuit structure, a severely discontinuous region of an electromagnetic field does not exist, and the layout density and the chip space utilization rate can be significantly improved.

BRIEF DESCRIPTION OF THE DRAWINGS

The present invention is further described below with reference to the accompanying drawings.

FIG. 3 shows a tail-level circuit layout of a microwave and millimeter-wave high-power monolithic integrated power amplifier according to an embodiment of the present invention. The numerals 301, 302, and so on in FIG. 3 correspond to 201, 202, and so on in FIG. 2 respectively, and the like.

DETAILED DESCRIPTION OF THE INVENTION

Embodiment 1

Figure 1:
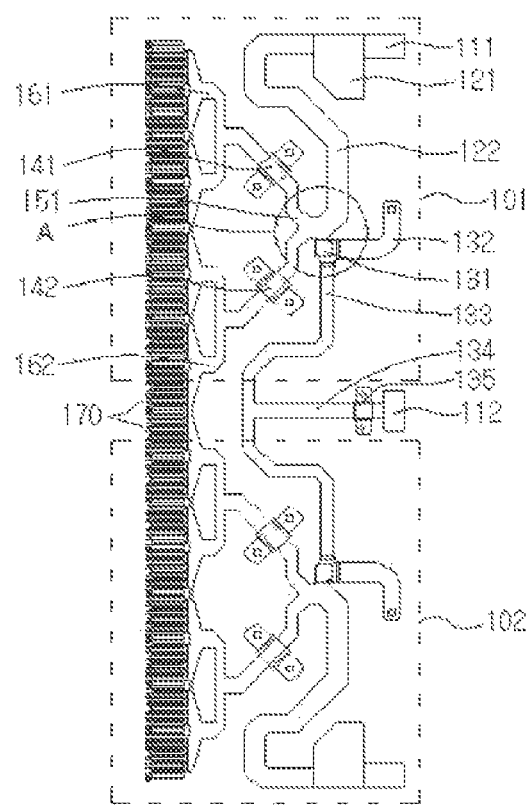
FIG. 1 shows a tail-level circuit layout of a microwave and millimeter-wave high-power monolithic integrated power amplifier in the prior art.
Figure 2:
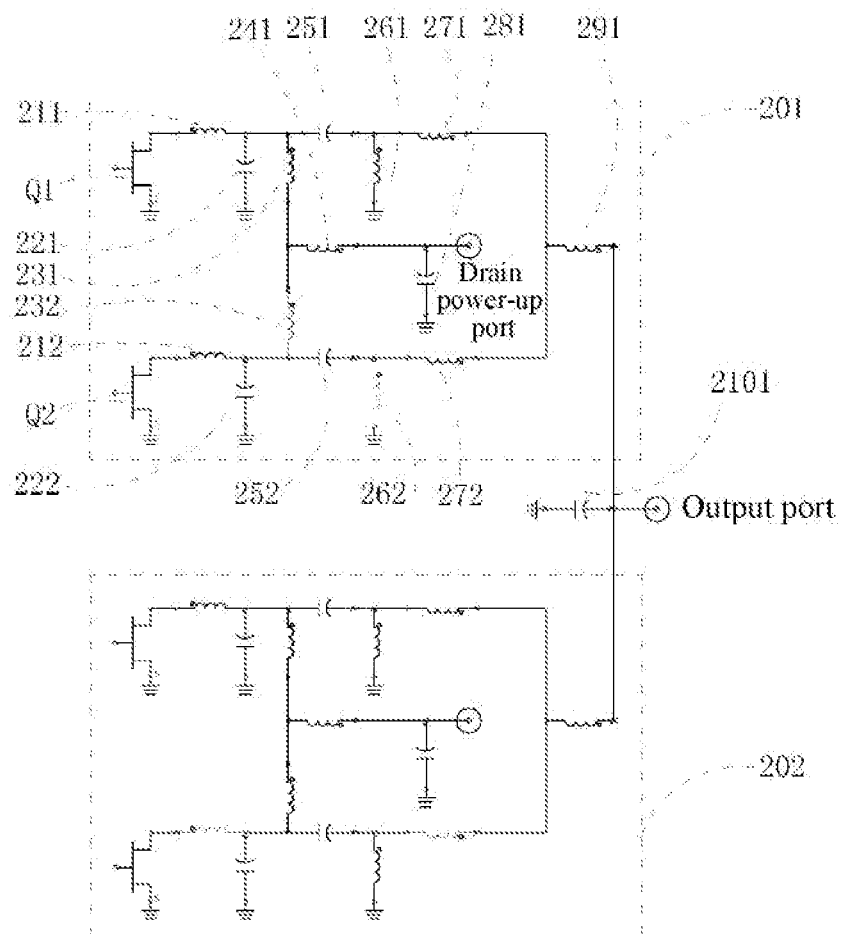
FIG. 2 is a principle view of an amplifier circuit with cross wiring of direct-current signals and microwave signals according to the present invention.
Figure 3:
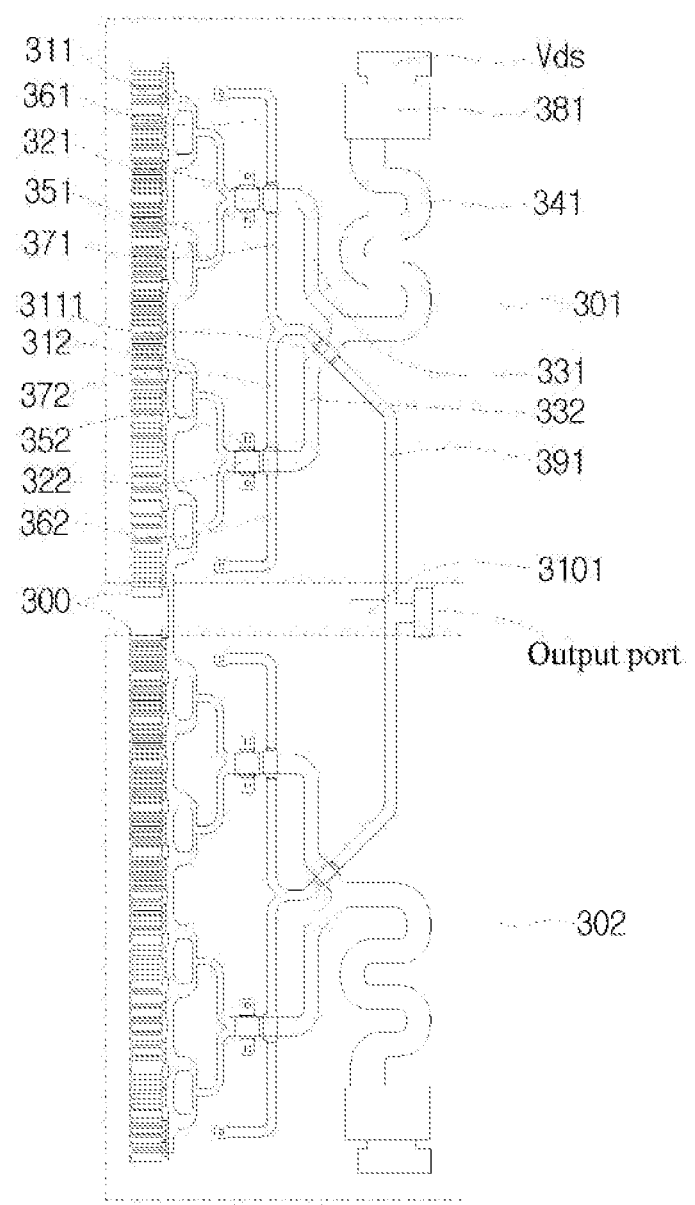

An amplifier circuit with cross wiring of direct-current signals and microwave signals in this embodiment is fabricated by using a semiconductor monolithic microwave integrated circuit (MMIC) process line, the principle view of the circuit is shown in FIG. 2, and the circuit layout is shown in FIG. 3. During the implementation of the circuit, a serially connected inductor is implemented by using micro-strip lines having different impedance, and a capacitor is implemented by using a lumped Metal-Insulator-Metal (MIM) capacitor. The circuit is formed of two circuit network units 301, 302 that are consistent in amplitude and phase of microwave power signals and are mirror circuits with each other. Each circuit network unit is formed of a direct-current feeding circuit and a microwave signal circuit. The direct-current signal circuit includes a transistor core drain power-up port VdS of a HEMT, a first MIM capacitor 381 connected in parallel, a first micro-strip line 341 connected in series, second micro-strip lines 331, 332 connected in series, and third micro-strip lines 311, 312 connected in series. The microwave signal circuit includes third micro-strip lines 311, 312 connected in series, second MIM capacitors 321, 322 connected in parallel, first MIM capacitors 351, 352 connected in series, ground micro-strip lines 361, 362 connected in parallel, fourth micro-strip lines 371, 372 connected in series, and a fifth micro-strip line 391 connected in series. The circuit network units 301, 302 are combined to reach an output port Pout through a parallel connected third MIM capacitor 3101. A three-dimensional cross is implemented between the second micro-strip 332 connected in series in the direct-current feeding circuit of the circuit and the fifth micro-strip 391 connected in series in the microwave signal circuit. The implementation manner of the cross uses an air bridge 3111 for bridging. The outputs of the two subunits that are mirror circuits with each other are combined to reach the output (Pout) port through the parallel connected third capacitor. The transistor core of the HEMT is extended into 8 cells, and every two cells are combined to be connected to one of the third inductors 211, 212 connected in series.

In the circuit units 301, 302, a direct-current feeding signal is transmitted in a transverse direction on a chip, and a microwave power signal is transmitted in an axial direction; such a circuit wiring manner may reduce crosstalk influence on a microwave power signal from noise that has various frequency components and is from a direct-current power source. For a circuit chip, a working frequency band, power, efficiency, consistency, a yield rate, and cost are taken into comprehensive consideration; the wafer in the chip uses a GaAs or GaN material as a substrate; however, the present invention is not only limited thereto.

Persons skilled in the art can easily conceive a three-dimensional cross between any serially connected inductor of the direct-current feeding circuit and any serially connected inductor of the microwave signal circuit according to the foregoing embodiment. Distributed micro-strip lines or lumped inductors may be adopted for the first inductor and the pair of second inductors in the direct-current feeding circuit and the pair of fourth inductors and the fifth inductor in the microwave signal circuit. In addition, in addition to a HEMT, the heterojunction FET may also be a modulation-doped FET (MODFET), a two-dimensional electron gas FET (2-DEG-FET), a selectively doped heterojunction transistor (SDHT), and the like.

It is proved through theory and tests that, this embodiment has the following advantageous effects:

1) A direct-current feeding circuit and a microwave signal circuit are completely symmetrical about a transistor core, and therefore, for every cell, the impedance of a load circuit of the cell is completely same, making it easy to exert the optimal performance of a transistor core.

2) A parallel connected second MIM capacitor is directly connected to a second capacitor connected in series. The freedom of the chip design is no longer limited by a fixed position of an intersecting point between a direct-current signal and a microwave power signal.

3) The circuit structure is relatively symmetrical, and the electromagnetic field is relatively continuous and homogeneous.

4) In the microwave signal circuit, the serially connected first MIM capacitor and a parallel connected ground microstrip significantly lower the sensitivity to the circuit performance. Therefore, sufficient discrete allowance is left for process processing, and mass production of chips becomes easy.

5) For circuit design with more cells, an eight-cell structure may be conveniently extended, thereby facilitating chip design of higher power.

6) A chip space utilization rate is improved, and chip cost is lowered.

In sum, this embodiment solves the difficult problem of matching from the output impedance of the large grid width power chip to a broadband having a high impedance ratio and a 50-ohm port, so as to fully explore high power and high efficiency performance of a large grid width transistor core.

What is claimed is:

1. An amplifier circuit with cross wiring of direct-current signals and microwave signals, comprising two branch mirror sub-circuits (201, 202) and a third capacitor (2101) connected in parallel to an output end, wherein the branch mirror sub-circuits comprises a direct-current feeding circuit and a microwave signal circuit, the direct-current feeding circuit is mainly formed of a transistor core drain power-up port (Vds) of a heterojunction field effect transistor (FET), a first capacitor (281), a first micro-strip inductor (241), a pair of second inductors (231, 232), and a pair of third inductors (211, 212), the transistor core drain power-up port (Vds) of the heterojunction FET is connected to the first micro-strip inductor (241) in series after passing through the first capacitor (281) connected in parallel, is respectively connected to one of a pair of third inductors (211, 212) in series by a pair of branched second inductors (231, 232), and is respectively connected to a transistor core drain port of the heterojunction FET, the microwave signal circuit is mainly formed of a pair of third inductors (211, 212), a pair of second capacitors (221, 222), a pair of first capacitors (251, 252), a pair of ground inductors (261, 262), a pair of fourth inductors (271, 272), and a fifth inductor (291), and the pair of third inductors (211, 212) is respectively connected to one of the pair of first capacitors (251, 252) in series after respectively passing through one of the pair of second capacitors (221, 222) connected in parallel, is respectively connected to one of the pair of ground inductors (261, 262) in parallel, and at the same time is respectively connected to one of the pair of fourth inductors (271, 272) in series, and is combined to be connected to an output end through the serially connected fifth inductor (291).

2. The amplifier circuit with cross wiring of direct-current signals and microwave signals according to claim 1, wherein a three-dimensional cross is formed between any serially connected inductor of the direct-current feeding circuit and any serially connected inductor of the microwave signal circuit.

3. The amplifier circuit with cross wiring of direct-current signals and microwave signals according to claim 2, wherein an air bridge structure is adopted for the three-dimensional cross.

4. The amplifier circuit with cross wiring of direct-current signals and microwave signals according to claim 3, wherein lumped inductors are adopted for the first inductor and the pair of second inductors in the direct-current feeding circuit and the pair of fourth inductors and the fifth inductor in the microwave signal circuit.

5. The amplifier circuit with cross wiring of direct-current signals and microwave signals according to claim 3, wherein distributed micro-strip lines are adopted for the first inductor and the pair of second inductors in the direct-current feeding circuit and the pair of fourth inductors and the fifth inductor in the microwave signal circuit.

6. The amplifier circuit with cross wiring of direct-current signals and microwave signals according to claim 4, wherein outputs of the two subunits (201, 202) that are mirror circuits with each other are combined to reach an output (Pout) port through the parallel connected third capacitor (2101).

7. The amplifier circuit with cross wiring of direct-current signals and microwave signals according to claim 6, wherein the heterojunction FET is a high-electron-mobility transistor (HEMT).

8. The amplifier circuit with cross wiring of direct-current signals and microwave signals according to claim 7, wherein a transistor core of the HEMT is extended into 8 cells, and every two cells are combined to be respectively connected to one of the serially connected third inductors (211, 212).

9. The amplifier circuit with cross wiring of direct-current signals and microwave signals according to claim 5, wherein outputs of the two subunits (201, 202) that are mirror circuits with each other are combined to reach an output (Pout) port through the parallel connected third capacitor (2101).

* * * * *